(12) United States Patent
Manabe et al.

(10) Patent No.: US 7,045,754 B2
(45) Date of Patent: May 16, 2006

(54) HYBRID CHARGE COUPLED CMOS IMAGE SENSOR HAVING AN AMPLIFICATION TRANSISTOR CONTROLLED BY A SENSE NODE

(75) Inventors: Sohei Manabe, San Jose, CA (US); Hidetoshi Nozaki, San Jose, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 267 days.

(21) Appl. No.: 10/816,077

(22) Filed: Mar. 30, 2004

(65) Prior Publication Data
US 2005/0219884 A1 Oct. 6, 2005

(51) Int. Cl.
*H01L 27/00* (2006.01)
(52) U.S. Cl. .............................. 250/208.1; 250/214 R

(58) Field of Classification Search ............ 250/208.1, 250/214 R
See application file for complete search history.

(56) References Cited

U.S. PATENT DOCUMENTS 6,317,154 B1* 11/2001 Beiley ..................... 348/308

* cited by examiner

*Primary Examiner*—Que T. Le
(74) *Attorney, Agent, or Firm*—Perkins Coie LLP

(57) ABSTRACT

An active pixel that incorporates elements of CCD technology into a CMOS image sensor is disclosed. Each pixel includes a reset transistor that resets a sense node. The active pixel includes an amplification transistor that is modulated by the signal on the sense node. A light sensing element, such as a photodiode, is provided and its signal is selectively read out by a transfer gate, selectively stored by a memory gate, and finally read out onto the sense node by a control gate. Underneath the memory gate is a memory well that acts as memory for the pixel and stores the signal output by the light sensing element.

23 Claims, 5 Drawing Sheets

HYBRID CHARGE COUPLED CMOS IMAGE SENSOR HAVING AN AMPLIFICATION TRANSISTOR CONTROLLED BY A SENSE NODE

TECHNICAL FIELD

The present invention relates to image sensors and more particularly to a CMOS image sensor that uses charge coupled technology to implement frame memory.

BACKGROUND

Image sensor technologies fall into two main categories: charge coupled devices (CCD) and CMOS image sensors. The advantages of each have been well documented. For example, CMOS image sensors have advantages with respect to power consumption, manufacturing costs, and circuit integration. Still, CCDs maintain advantages in certain high-end applications.

There have been attempts to integrate the two technologies so that an image sensor would have the advantages of both. For example, U.S. Pat. No. 5,625,210 purports to combine commonly used pinned photodiode technology from CCD image sensors with CMOS controlled circuitry.

The present invention combines aspects of CCD technology into a CMOS image sensor.

DETAILED DESCRIPTION

In the following description, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
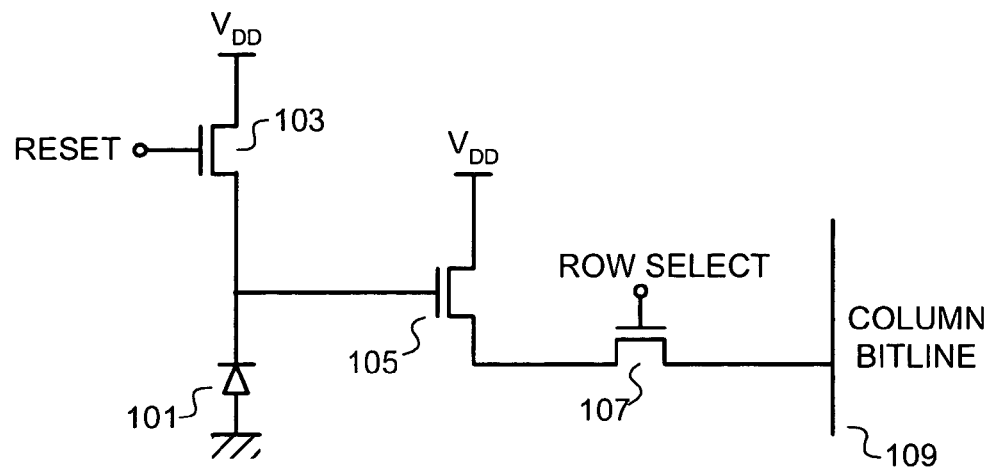
FIG. 1 is a schematic diagram of a prior art three transistor active pixel used in a CMOS image sensor.

The present invention combines certain aspects of CCD technology with CMOS process technology. FIG. 1 illustrates a prior art CMOS active pixel that uses three transistors. A light sensing element 101 outputs a signal that is used to modulate an amplification transistor 105. The amplification transistor is also known as a source-follower transistor. The light sensing element 101 can be one of a variety of devices, including without limitation, photogates, photodiodes, pinned photodiodes, partially pinned photodiodes, etc.

During an integration period, the light sensing element 101 captures light and outputs a signal indicative of the amount of light incident onto that light sensing element 101. The signal is used to modulate the amplification transistor 105. After the integration period, a reset transistor 103 is used to reset the level of the light sensing element output node to a reference level. Finally, a row select transistor 107 is used as a means to address the pixel and to selectively read out the signal from the pixel onto a column bit line 109.

Figure 2:
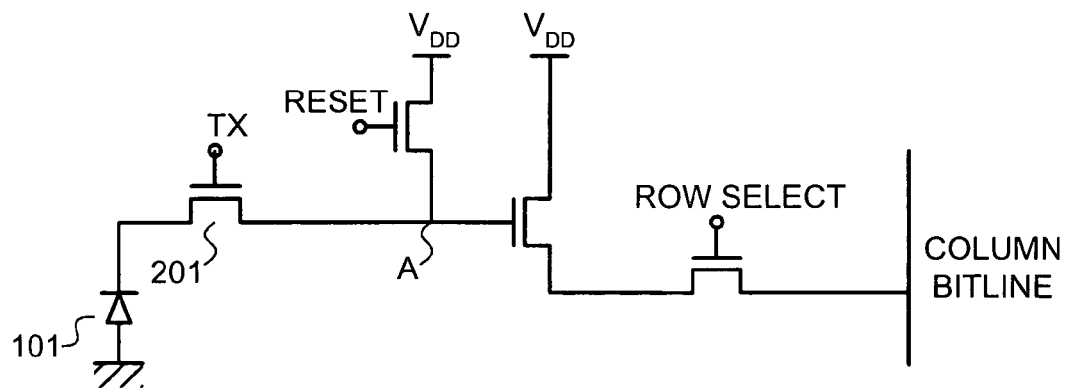
FIG. 2 is a schematic diagram of a prior art four transistor active pixel used in a CMOS image sensor.

FIG. 2 is similar in many respects to the three transistor active pixel of FIG. 1, except that an additional transfer transistor 201 is used to transfer the signal output by the light sensing element 101 to a floating node A. Although a four transistor active pixel may be larger in size because of the transfer gate 201, advantages relative to the three transistor active pixel of FIG. 1 are still gained.

Figure 3:
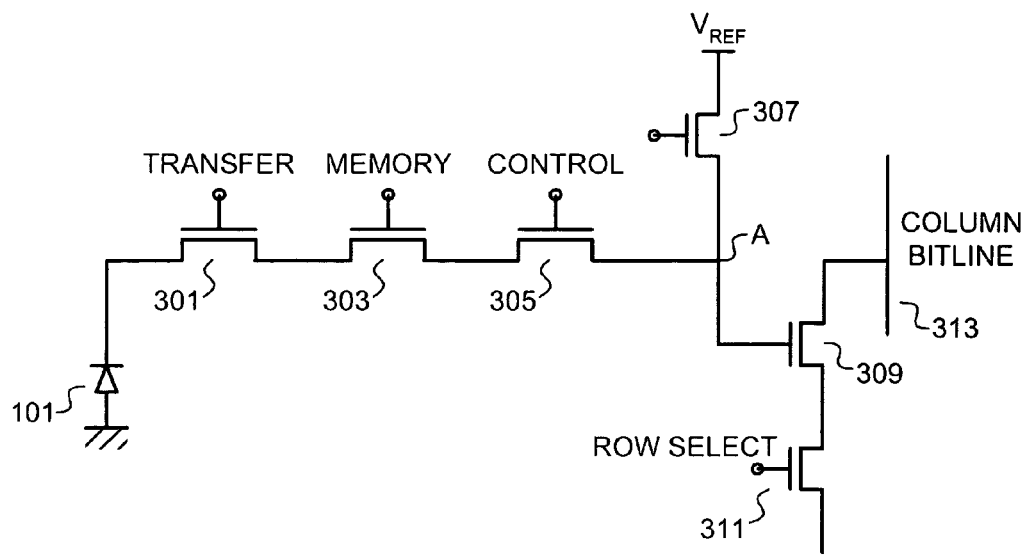
FIG. 3 is a schematic diagram of an active pixel formed in accordance with the present invention.

Turning to FIG. 3, an active pixel formed in accordance with the present invention is shown. In this active pixel, a light sensing element 101 (which includes without limitation photogates, photodiodes, pinned photodiodes (sub-species of photodiodes), partially pinned photodiodes (sub-species of photodiodes), and the like) has its signal transferred out to a sense node A by means of three gates: a transfer gate 301, a memory gate 303, and a control gate 305.

Once the signal from the light sensing element 101 is at the sense node A, the circuitry is similar to the prior art and includes a reset transistor 307, an amplification transistor 309, and a row select transistor 311. The signal on sense node A modulates the amplification transistor 309 such that the appropriate amplified signal is placed onto a column bit line 313. The row select transistor 311 is utilized to selectively address the active pixel in this embodiment.

By including the memory gate 303 and the control gate 305, each active pixel can incorporate memory in an analogous manner to CCD image sensors. In particular, once an integration period is completed by the light sensing element 101, both the transfer gate 301 and the memory gate 303 are activated. Specifically, a voltage ($V_{on}$) is applied to the transfer and memory gates 301 and 303. Note that the voltage $V_{on}$ is a positive voltage for a p-type substrate. For an n-type substrate, $V_{on}$ is a negative voltage. Further, the precise magnitude of $V_{on}$ is a voltage that is determined by various design parameters of the pixel, but typically will be derived from $V_{dd}$ or $V_{cc}$.

The application of $V_{on}$ to the transfer and memory gates 301 and 303 will form a potential well (memory well 401) underneath the memory gate 303. Further, by applying a voltage to the transfer gate 301, charge (signal) generated by the light sensing element 101 will flow to the memory well 401 underneath the memory gate 303.

The memory gate 303 can then be held at voltage $V_{on}$ while the transfer gate 301 returns to a quiescent voltage (either 0 volts or some fixed bias voltage). This will result in the signal from the light sensing element 101 being held in the memory well 401. In order to transfer the charge from the memory well 401 to the sense node A, the control gate 305 is then activated to $V_{on}$ while the memory gate 303 returns to the quiescent state. This will result in transferring the signal from the memory well 401 to the sense node A. This is also under the control of both the control gate 305 and the memory gate 303.

Once the signal from the light sensing element 101 has been placed onto the sense node A, operation of the active pixel is similar to that of FIGS. 1 and 2. In other words, the signal on the sense node A is periodically reset using the reset transistor 307. Further, the signal on the sense node is used to modulate the amplification transistor 309 to output a amplified signal onto the column bitline 313. The row select transistor 311 is used to selectively address the pixel.

Figure 4:
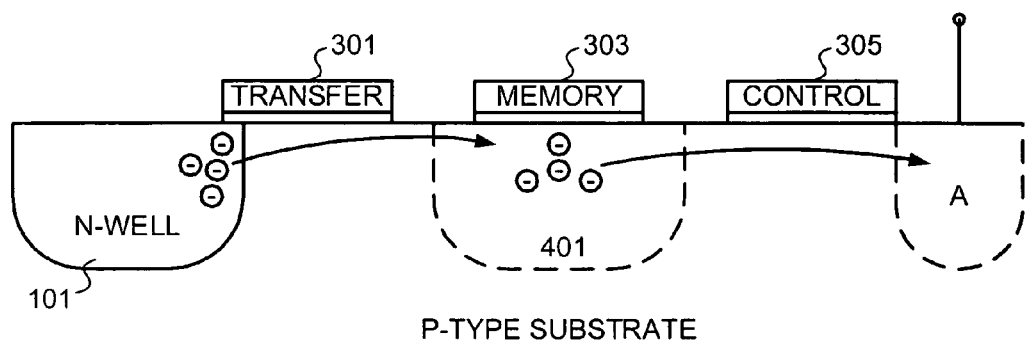
FIG. 4 is a cross sectional view of a portion of the active pixel of FIG. 3.

FIG. 4 shows a cross section view of a semiconductor substrate showing the light sensing element 101 (in this case a photodiode), the transfer gate 301, the memory gate 303, the control gate 305, and the memory well 401. The transfer gate 301, memory gate 303, and control gate 305 are separated from the semiconductor substrate by a gate dielectric, such as a thin gate oxide. Also shown is the sensing node A. The transfer gate 301 is adjacent to the light sensing element 101. The term adjacent as used herein includes non-overlapping, overlapping, and aligned and may vary with different design parameters. In any event, the transfer gate 301 should be disposed in a position to facilitate transfer of charge out of the light sensing element 101.

It can be appreciated that what is shown in FIGS. 3 and 4 is but one pixel in an array of pixels that form an image sensor. In many embodiments, the number of pixels in the image sensor array can range from hundreds of pixels to millions of pixels. Typically, the image sensor array has many pixels arranged as rows and columns. However, the present invention is directed towards the internal structure of a single pixel, and that pixel can be utilized in a variety of architectures.

Thus, as seen in FIG. 4, a signal (represented as electrons) generated by the light sensing element 101 can be transferred by activating the transfer gate 301 and memory gate 303. This transfer allows the signal to move from the N-well of a photodiode comprising the light sensing element 101 into the memory well 401. The memory gate 303 and control gate 305 can then be controlled such that the signal is either stored within the memory well 401 or transferred to the sense node A. For example, the control transistor 305 can be activated at the desired time to have the signal read out from the memory well 401 into the sense node A.

The inclusion of the memory well 401 and the structure of the pixels of the present invention provide the ability to support "frame exposure." In other words, the image sensor using the present active pixels can expose the entire array to incident light and store the entire image (the frame) in the memory wells 401. This is in contrast to the conventional raster scanning readout techniques of many prior art image sensors. Moreover, with appropriate process design, the memory well 401 can store the signal captured by the light sensing element 101 for a relatively long period of time, thereby giving a long memory duration.

Figure 5:
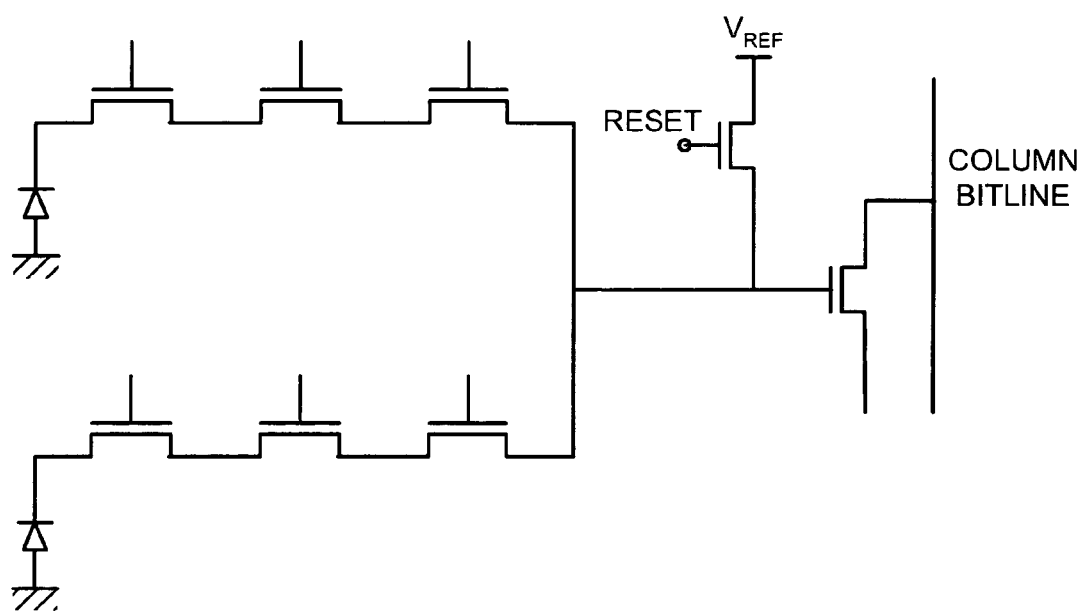
FIG. 5 is a schematic diagram of an alternative embodiment of the present invention showing the use of shared transistors.

While there is an increase of gates in each active pixel, the amount of increase of gates can be mitigated by the used of shared transistor technology. In particular, as seen in FIG. 5, two or more adjacent pixels can share a reset transistor and an amplification transistor. Thus, by appropriate timing of the read out process, two or more adjacent pixels can share transistors and the total number of transistors required to implement an imaging array can be reduced. Further details of this type of shared transistor architecture can be found in commonly owned and co-pending U.S. patent application Ser. No. 10/771,839 entitled "CMOS IMAGE SENSOR USING SHARED TRANSISTORS BETWEEN PIXELS" filed on Feb. 4, 2004, which is herein incorporated by reference.

Figure 6:
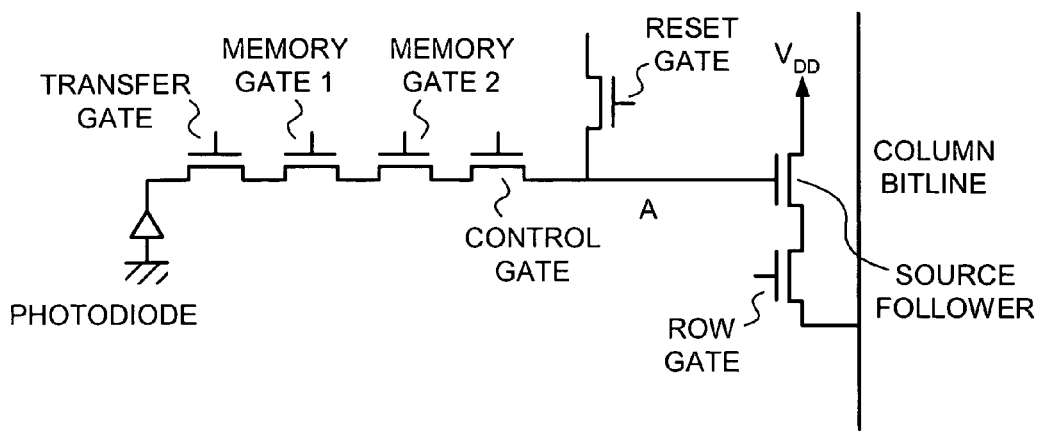
FIG. 6 shows schematic and cross sectional views of yet another alternative embodiment utilizing an additional memory gate.
Figure 6:
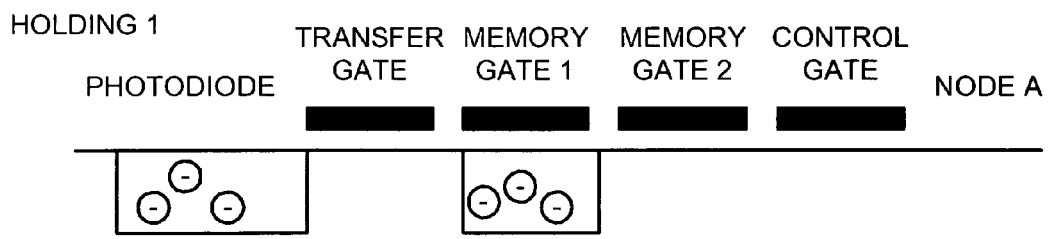
Figure 6:
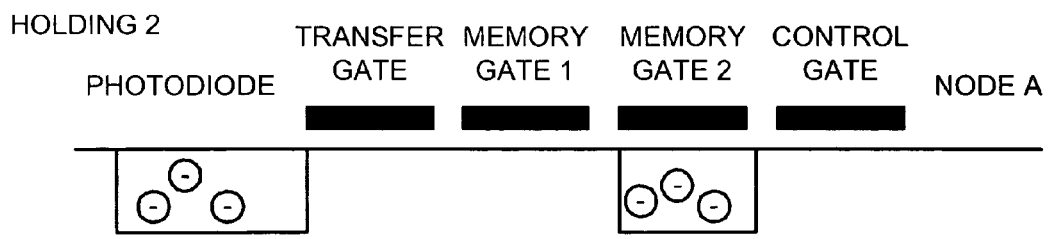
Figure 7:
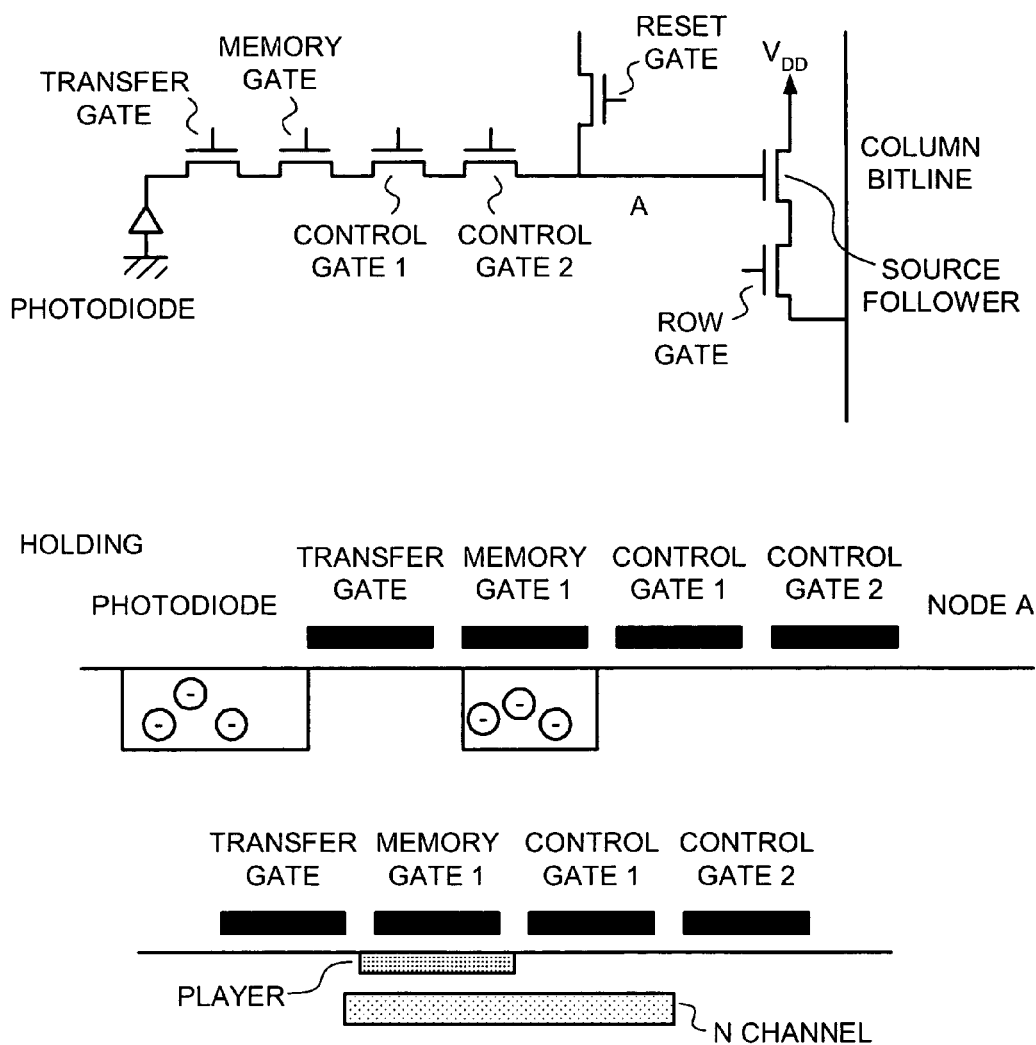
FIG. 7 shows schematic and cross sectional views of yet another alternative embodiment utilizing a p-type layer underneath the memory gate and an additional control gate.

Furthermore, additional embodiments are also seen in connection with FIGS. 6 and 7. While the embodiment of FIGS. 3 and 4 shows the basic invention concept, in that embodiment, the silicon surface beneath the memory gate 303 is depleted when holding signal charges. This depletion causes a relatively large leakage current from the silicon surface. The alternative embodiments described below reduce the amount of leakage current from the silicon surface.

FIG. 6 illustrates in schematic form and cross section an alternative embodiment of the present invention. Similar to the previous embodiment, the transfer gate is provided adjacent to the photodiode. However, a memory gate 2 is provided in addition to memory gate 1 and the control gate between the transfer gate and node A. Further, for ease of manufacturing, the first and second memory gates, the transfer gate, and the control gate are all formed from the same layer of polysilicon.

In operation, initially memory gate 1, memory gate 2 and the control gate are all turned on to reset all regions beneath these gates. Then, memory gate 1, memory gate 2 and control gate are turned off sequentially. The signal generated by the incident light in the photodiode is transferred to under the memory gate 1 through the transfer gate by turning on the transfer gate and memory gate. At this time, memory gate 2 is turned off. Then, the transfer gate is turned off. This results in the signal being held beneath the memory gate 1.

At a next step, the memory gate 2 is turned on as memory gate 1 is turned off. At this time, the signal is then held beneath memory gate 2.

Next, memory gate 1 is turned on as memory gate 2 is turned off. The signal is then transferred back to underneath memory gate 1. The signal is thus alternately transferred back and forth between memory gate 1 and memory gate 2. In one embodiment, the transfer back and forth is at 1000 Hertz or more. This transfer back and forth occurs until the signal charges are read out to the column bit-line through the source follower.

The embodiment of FIG. 6 decreases leakage current from the silicon surface. Leakage current from silicon surface is believed to relate to slow surface states at the silicon surface. The slow surface states cannot commonly respond to more than 1000 Hertz driving. Thus, when memory gates 1 and 2 are switched on and off at more than 1 kHz, leakage current from the silicon surface should not increase. Still, the present invention is not limited to switching at greater than 1000 Hertz and other mechanism may come into play that make the present invention advantageous at less than 1000 Hertz switching.

FIG. 7 illustrates in schematic form and cross section the third embodiment of the present invention. This embodiment includes a memory gate, a first control gate 1 and a second control gate 2 between the transfer gate and node A.

Note that in this embodiment, a p-type layer covers the silicon surface beneath the memory gate to avoid leakage current from the silicon surface. The p-type layer can be formed using a conventional masking and implantation step. An n-channel is formed at a deeper region than the p-type layer beneath the memory gate and control gate.

In operation, the n-channel is reset by turning on the memory gate, control gate 1, and control gate 2. Then, control gate 2 is turned off, and memory gate and control gate 1 are turned on. Next, the memory gate is set to a quiescent voltage (0 or negative voltage) or floating. The n-channel potential is set by the potential beneath the control gate 1. Then, the signal charges from the photodiode are transferred to the memory gate and control gate1 by turning on and off the transfer gate. Then, the control gate 1 is turned off. At this time, the signal charges are held at the n-channel region beneath the memory Gate.

Note that in yet another alternative embodiment, control gate 2 may be omitted. In such an embodiment, the structure is similar to that of FIG. 3, except with the addition of the p-type layer and n-channel.

When the signal charges are to be read out, the potential beneath control gate 2 is set to some potential. Then, the potential beneath control gate 1 is set to a shallower potential than that of control gate 2 by applying voltage to control gate 1. Next, the memory gate is turned off. Signal charges are then transferred to node A through control gates 1 and 2. This architecture also decreases leakage current from the silicon surface. Since the silicon surface beneath the memory gate is not depleted by the p-type layer, leakage current from the silicon surface is small.

The description of the invention and its applications as set forth herein is illustrative and is not intended to limit the scope of the invention. Variations and modifications of the embodiments disclosed herein are possible, and practical alternatives to, or equivalents of the various elements, of the embodiments are known to those of ordinary skill in the art. Further, the various doping types may be reversed, such that an n-channel transistor described above may be replaced with a p-channel transistor. These and other variations and modifications of the embodiments disclosed herein may be made without departing from the scope and spirit of the invention.

We claim:

1. An active pixel comprising:
   a light sensing element formed in a semiconductor substrate;
   a transfer gate adjacent to said light sensing element for transferring out a signal from said light sensing element;
   a memory gate adjacent to said transfer gate;
   a control gate adjacent to said memory gate for transferring out said signal to a sense node; and
   an amplification transistor controlled by said sense node.

2. The pixel of claim 1 wherein said light sensing element is selected from the group of photodiode, pinned photodiode, partially pinned photodiode, or photogate.

3. The pixel of claim 1 wherein said memory gate when activated forms a memory well in said substrate underneath said memory gate, said memory well capable of storing said signal from said light sensing element.

4. The pixel of claim 1 wherein said amplification transistor outputs an amplified version of said signal to a column bitline.

5. The pixel of claim 1 further including a reset transistor operative to reset said sense node to a reference voltage.

6. An active pixel comprising:
   a photodiode formed in a semiconductor substrate;
   a transfer gate adjacent to said light sensing element for transferring out a signal from said light sensing element;
   a memory gate adjacent to said transfer gate;
   a control gate adjacent to said memory gate for transferring out said signal to a sense node;
   an amplification transistor controlled by said sense node, wherein said amplification transistor outputs an amplified version of said signal to a column bitline;
   a reset transistor operative to reset said sense node to a reference voltage.

7. An apparatus comprising:
   a first pixel comprising:
      a first light sensing element formed in a semiconductor substrate;
      a first transfer gate adjacent to said first light sensing element for transferring out a first signal from said first light sensing element;
      a first memory gate adjacent to said first transfer gate;
      a first control gate adjacent to said first memory gate for transferring out said first signal to a sense node;
   a second pixel comprising:
      a second light sensing element formed in a semiconductor substrate;
      a second transfer gate adjacent to said second light sensing element for transferring out a second signal from said second light sensing element;
      a second memory gate adjacent to said second transfer gate;
      a second control gate adjacent to said second memory gate for transferring out said second signal to a sense node;
   a reset transistor coupled to the output node for resetting the output node to a reference voltage; and
   an output transistor that is coupled to the sense node.

8. The apparatus of claim 7 wherein said first pixel is in a first row of an imaging array and said second pixel is in a second row of an image array adjacent to said first row.

9. The apparatus of claim 7, wherein the output transistor is connected to a column bitline without the use of a row select transistor.

10. The apparatus of claim 7, wherein said output transistor has its gate coupled to said output node.

11. An active pixel comprising:
    a light sensing element formed in a semiconductor substrate;
    a transfer gate adjacent to said light sensing element for transferring out a signal from said light sensing element;
    a first memory gate adjacent to said transfer gate;
    a second memory gate adjacent to said first memory gate;
    a control gate adjacent to said second memory gate for transferring out said signal to a sense node; and
    an amplification transistor controlled by said sense node.

12. The pixel of claim 11 wherein said light sensing element is selected from the group of photodiode, pinned photodiode, partially pinned photodiode, or photogate.

13. The pixel of claim 11 wherein when either of said memory gates are activated forms a memory well in said substrate underneath the respective said memory gate, said memory well capable of storing said signal from said light sensing element.

14. The pixel of claim 11 wherein said first and second memory gates are selectively activated to alternately store said signal from said light sensing element.

15. The pixel of claim 14 wherein said first and second memory gates operate at a frequency of greater than 1000 Hertz.

16. The pixel of claim 11 wherein said first and second memory gates, said transfer gate, and said control gate are formed from the same layer of polysilicon.

17. The pixel of claim 11 further including a reset transistor operative to reset said sense node to a reference voltage.

18. An active pixel comprising:
a light sensing element formed in a semiconductor substrate;
a transfer gate adjacent to said light sensing element for transferring out a signal from said light sensing element;
a memory gate adjacent to said transfer gate;
a p-type layer formed in the surface of said semiconductor substrate underneath said memory gate;
a control gate adjacent to said memory gate for transferring out said signal to a sense node; and
an amplification transistor controlled by said sense node.

19. The pixel of claim 18 wherein said light sensing element is selected from the group of photodiode, pinned photodiode, partially pinned photodiode, or photogate.

20. The pixel of claim 18 wherein said memory gate when activated forms a memory well in said substrate underneath said memory gate, said memory well capable of storing said signal from said light sensing element.

21. The pixel of claim 18 further including an n-channel formed in said semiconductor substrate and beneath said p-type layer.

22. The pixel of claim 18 further including a second control gate between said control gate and said sense node.

23. The pixel of claim 18 further including a reset transistor operative to reset said sense node to a reference voltage.

* * * * *